United States Patent [19]

Nakamura et al.

[11] Patent Number: 5,124,582
[45] Date of Patent: Jun. 23, 1992

[54] BI-CMOS CIRCUIT WITH HIGH-SPEED ACTIVE PULL-DOWN OUTPUT CURRENTS

[75] Inventors: Toru Nakamura, Kushikino; Toshiyuki Koreeda, Sendai, both of Japan

[73] Assignees: Fujitsu Limited, Kanagawa; Kyushu Fujitsu Electronics Limited, Kagoshima, both of Japan

[21] Appl. No.: 605,325

[22] Filed: Oct. 30, 1990

[30] Foreign Application Priority Data

Nov. 2, 1989 [JP] Japan .................. 1-286119

[51] Int. Cl.⁵ ............................................ H03K 17/04
[52] U.S. Cl. .................................. 307/446; 307/443; 307/570
[58] Field of Search ............... 326/481.7 J, 472.5 H, 326/485.8 R, 486.5 T; 307/446, 443, 570, 450

[56] References Cited

U.S. PATENT DOCUMENTS

| | | | |
|---|---|---|---|
| 4,645,952 | 2/1987 | van Tran | 307/448 |
| 4,697,103 | 9/1987 | Ferris et al. | 307/443 |
| 4,704,548 | 11/1987 | Strong et al. | 307/443 |
| 4,739,198 | 4/1988 | Maruyama | 307/530 |
| 4,829,201 | 5/1989 | Masuda et al. | 307/446 |
| 4,845,386 | 7/1989 | Ueno | 307/446 |
| 4,902,914 | 2/1990 | Masuoka | 307/446 |
| 4,970,414 | 11/1990 | Ruth, Jr. | 307/542 |
| 4,975,600 | 12/1990 | Tran et al. | 307/443 |
| 4,999,523 | 3/1991 | Cham et al. | 307/570 |

FOREIGN PATENT DOCUMENTS 0072694 2/1983 European Pat. Off. .
0212004 3/1987 European Pat. Off. .

OTHER PUBLICATIONS

Patent Abstracts of Japan, vol. 7, No. 218 (E-200) [1363], Sep. 28, 1983, and JP-A-58 111 525.

Primary Examiner—Stanley D. Miller
Assistant Examiner—Scott A. Ouellette
Attorney, Agent, or Firm—Nikaido, Marmelstein, Murray & Oram

[57] ABSTRACT

A Bi-CMOS circuit according to the present invention includes a first transistor made from an N-channel MOS transistor that is turned on and off in response to the logic state of an input signal and that supplies a first current to the base of an output transistor when the first transistor is turned on, and an active pull-down current supplying means connected to the gate electrode of the first transistor. The active pull-down current supplying means provides a second current, which is an active pull-down current, to the base of the output transistor so that the first and second currents can be supplied to the base of the output transistor.

4 Claims, 5 Drawing Sheets

BI-CMOS CIRCUIT WITH HIGH-SPEED ACTIVE PULL-DOWN OUTPUT CURRENTS

FIELD OF THE INVENTION

The present invention relates to a logic circuit, and more particularly to a logic circuit of Bi-CMOS construction used for driving capacitive load.

DESCRIPTION OF THE PRIOR ART

In the Bi-CMOS process that adds a part of a MOS process to a normal bipolar process and that forms bipolar elements and MOS elements at the same time, a logic circuit of high performance can be made by building a bipolar circuit having advantages of high accuracy analog processing and large power drive and a CMOS circuit having advantages of high integration and low power consumption, together on the same IC chip.

FIG. 7 schematically shows a conventional logic circuit which forms an inverter with the Bi-CMOS process. In the figure, $M_{n1}$ is an input transistor made from an N-channel MOS transistor, $Q_1$ and $Q_2$ are off-buffer transistors made from bipolar transistors, and $Q_3$ is an output transistor made from a bipolar transistor. $R_1$ through $R_4$ are resistors, and $D_1$, $D_2$ schottky barrier diodes. C is capacitive load, $V_{IN}$ an input signal, and $V_{OUT}$ an output signal. In a construction such as this, in order to obtain a high drive capability, $Q_1$ and $Q_3$ normally comprise transistors with schottky barriers, and alternatively, the areas of $Q_2$ and $Q_3$ are increased.

In the conventional logic circuit described above, particularly when the area of the transistor $Q_3$ is increased to obtain a high drive capability, it is necessary to increase current that is supplied to the base of the output transistor $Q_3$. However, since the MOS transistor ($M_{n1}$) is used as a source of the base current, a sufficient amount of the base current cannot be supplied to the output transistor $Q_3$. Consequently, there is the drawback that the output transistor $Q_3$ is turned on very slowly, that is, the propagation delay time $t_{PHL}$ of the output signal $V_{OUT}$ increases.

Accordingly, it is an object of the present invention to make the turn-on speed of the output transistor $Q_3$ faster and shorten the propagation delay time $t_{PHL}$ of the output signal $V_{OUT}$.

SUMMARY OF THE INVENTION

In accordance with one important aspect of the present invention, there is provided a Bi-CMOS circuit comprising a first transistor made from an N-channel MOS transistor that is turned on and off in response to the logic state of an input signal and that supplies a first current to the base of an output transistor when the first transistor is turned on, and an active pull-down current supplying means connected to the gate electrode of the first transistor and for supplying a second current, which is active pull-down current, to the base of the output transistor so that the first and second currents can be supplied to the base of the output transistor.

The active pull-down current supplying means may comprise a second transistor made from a P-channel MOS transistor and having its gate electrode connected to the gate electrode of the first transistor, a third transistor made from an N-channel MOS transistor and having its gate electrode connected to the gate electrode of the second transistor, the third transistor being connected in series with the second transistor, and a fourth transistor made from a bipolar transistor and having its base connected to the third transistor and its emitter connected to the base of the output transistor.

The second transistor may be substantially identical in area with the third transistor. The second transistor may also be greater in area than the third transistor.

The active pull-down current supplying means may also be comprise a second transistor made from a P-channel MOS transistor and having its gate electrode connected to the gate electrode of the first transistor, a third transistor made from an N-channel MOS transistor and having its gate electrode connected to the gate electrode of the second transistor, the third transistor being connected in series with the second transistor, a fourth transistor made from a P-channel MOS transistor, a fifth transistor made from an N-channel MOS transistor and having its gate electrode connected to the gate electrode of the fourth transistor, the fifth transistor being connected in series with the fourth transistor, a line between the second and third transistors being connected to a line between the fourth and fifth transistors, and a sixth transistor made from a bipolar transistor and having its base connected to the fifth transistor and its emitter connected to the base of the output transistor.

In the present invention, during the turn-on transition period of the first transistor (corresponding to the conventional input transistor $M_{n1}$), the second and third transistors are turned on, and the fourth transistor made from a bipolar transistor is turned on by the current that flows through the second and third transistors. Consequently, the current that flows through both first transistor and the fourth transistor is supplied to the base of the output transistor (corresponding to the transistor $Q_3$), and the turn-on speed of the output transistor is thus made faster.

In accordance with another important aspect of the present invention, there is provided a Bi-CMOS circuit comprising first and second transistors respectively made from a P-channel MOS transistor and an N-channel MOS transistor that are turned on and off in response to the logic state of an input signal and that supplies a first current to the base of an output transistor when the first and second transistors are turned on, and an active pull-down current supplying means connected to the gate electrodes of the first and second transistors and for supplying a second current, which is active pull-down current, to the base of the output transistor so that the first and second currents can be supplied to the base of the output transistor.

In accordance with yet another important aspect of the present invention, there is provided a Bi-CMOS circuit comprising a first transistor made from an N-channel MOS transistor that is turned on and off in response to the logic state of an input signal and that supplies a first current to the base of a first output transistor when the first transistor is turned on, second and third transistors respectively made from a P-channel MOS transistor and an N-channel MOS transistor that are turned on and off in response to the logic state of the input signal and that supplies a second current to the base of a second output transistor when the second and third transistors are turned on, a first active pull-down current supplying means connected to the gate electrode of the first transistor and for supplying a third current, which is an active pull-down current, to the base of the first output transistor so that the first and third currents can be supplied to the base of the first output transistor, and a second active pull-down current supplying means connected to the gate electrodes of the second and third transistors and for supplying a fourth current, which is an active pull-down current, to the base of the second output transistor so that the second and fourth currents can be supplied to the base of the second output transistor. The third current supplied through the first active pull-down current supplying means is an supplied to the base of the first output transistor when the input signal makes a transition from a low to a high, while the fourth current supplied through the second active pull-down current supplying means is supplied to the base of the second output transistor when the input signal makes a transition from a high to a low.

BRIEF DESCRIPTION OF THE DRAWINGS

The above and other objects and advantages will become apparent from the following detailed description when read in conjunction with the accompanying drawings wherein.

DESCRIPTION OF THE PREFERRED EMBODIMENTS

Figure 1:
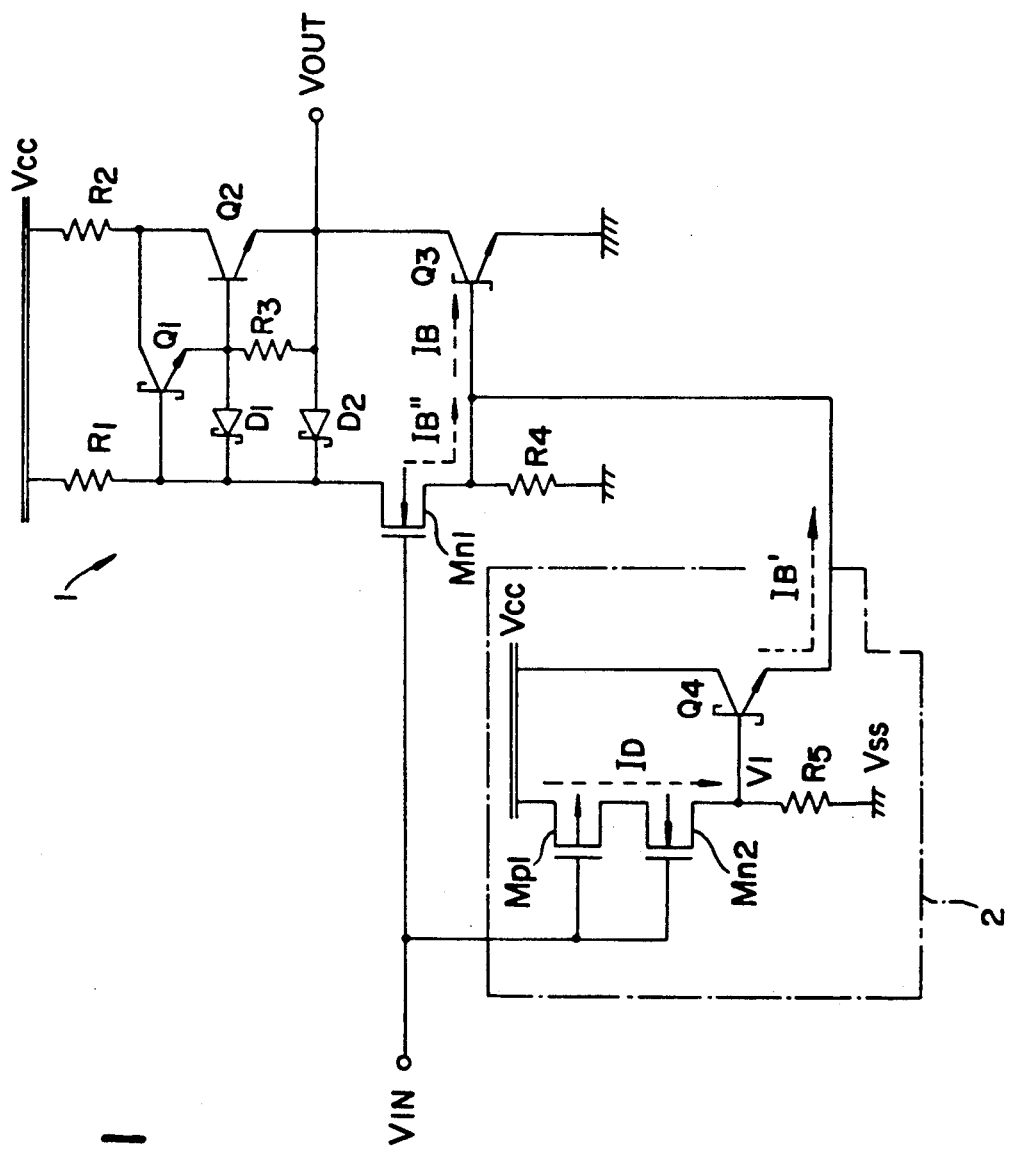
FIG. 1 is a schematic view illustrating an embodiment of a Bi-CMOS circuit in accordance with the present invention.

Referring now in greater detail to the drawings and initially to FIGS. 1 through 4, there is shown a preferred embodiment of a Bi-CMOS circuit constructed in accordance with the present invention. The same reference characters and numbers will be applied to the same parts as FIG. 5. Reference numeral 1 denotes a gate part that functions as an inverter. The gate part 1 comprises off-buffer transistors $Q_1$ and $Q_2$ each made from a bipolar transistor, an output transistor $Q_3$ made from a bipolar transistor, and an input transistor (first transistor $M_{n1}$ made from an N-channel MOS transistor. The logic state of an output signal $V_{OUT}$ of the inverter is determined by turning on either the off-buffer transistors $Q_1$ and $Q_2$ of high level side or the output transistor $Q_3$ of low level side with an ON/OFF operation of the input transistor $M_{n1}$.

That is, if the input signal $V_{IN}$ is in a logic low state, the input transistor $M_{n1}$ is turned off and the off-buffer transistors $Q_1$ and $Q_2$ are turned on. Consequently, the output signal $V_{OUT}$ goes to a logic high state. If, on the other hand, the input signal $V_{IN}$ is in a logic high state, then the input transistor $M_{n1}$ is turned on, a base current $I_B$ is supplied to the output transistor $Q_3$, and therefore the output transistor $Q_3$ is turned on. Consequently, the output signal $V_{OUT}$ goes to a logic low state.

Reference numeral 2 is an auxiliary drive circuit which is the gist of the present invention. Between a high level power supply $V_{cc}$ and a low level ground $V_{ss}$, the auxiliary drive circuit 2 comprises a P-channel MOS transistor (second transistor) $M_{p1}$, an N-channel MOS transistor (third transistor) $M_{n2}$, and a resistor $R_5$ which are connected in series. The auxiliary drive circuit 2 further comprises a bipolar transistor $Q_4$ (fourth transistor) having its base connected to the line between $M_{n2}$ and $R_5$ and its emitter connected to the base of the output transistor $Q_3$.

Assume now that the area of $M_{p1}$ is substantially the same as that of $M_{n2}$. This makes the turn-on speed of $M_{n2}$ faster than that of $M_{p1}$ by the difference of carrier mobility (the mobility of electrons $\mu n$ is about two or three times greater than the mobility of holes $\mu p$) between the two transistors (P-channel and N-channel MOS transistors). Consequently, when the input signal $V_{IN}$ makes a transition from a low state to a high state, the transistors $M_{p1}$ and $M_{n2}$ can be both turned on instantaneously. When this occurs, current $I_D$ flows through the transistors $M_{p1}$ and $M_{n2}$, and causes voltage $V_1$ to generate across the resistor $R_5$. If $V_1$ is greater than the total value of the base-emitter voltage $V_{BE4}$ of $Q_4$ and the base-emitter voltage $V_{BE3}$ of $Q_3$ ($2 V_{BE} = V_{BE3} + V_{BE4}$), then $Q_4$ is turned on by $V_1$ and the emitter current $I_{B'}$ can be added to the base current $I_B$ of $Q_3$. That is, the total current of the current $I_{B''}$ supplied through $M_{n1}$ and the current $I_{B'}$ supplied through $Q_4$ can be employed as the base current $I_B$ ($I_B = I_{B'} + I_{B''}$) of $Q_3$, so the base current $I_B$ of $Q_3$ can be increased instantaneously during the low-to-high transition period of $V_{IN}$. Consequently, the turn-on speed of $Q_3$ can be made faster, and the high-to-low transition speed of the output signal $V_{OUT}$ is made faster and the propagation delay time $t_{PHL}$ of the output signal $V_{OUT}$ is thus shortened. The current $I_{B40}$ functions as active pull-down current, makes the turn-on of $Q_3$ deep, and can rapidly pull out a wiring load capacity connected to $V_{OUT}$. As a result, high-speed operation can be performed.

Figure 2:
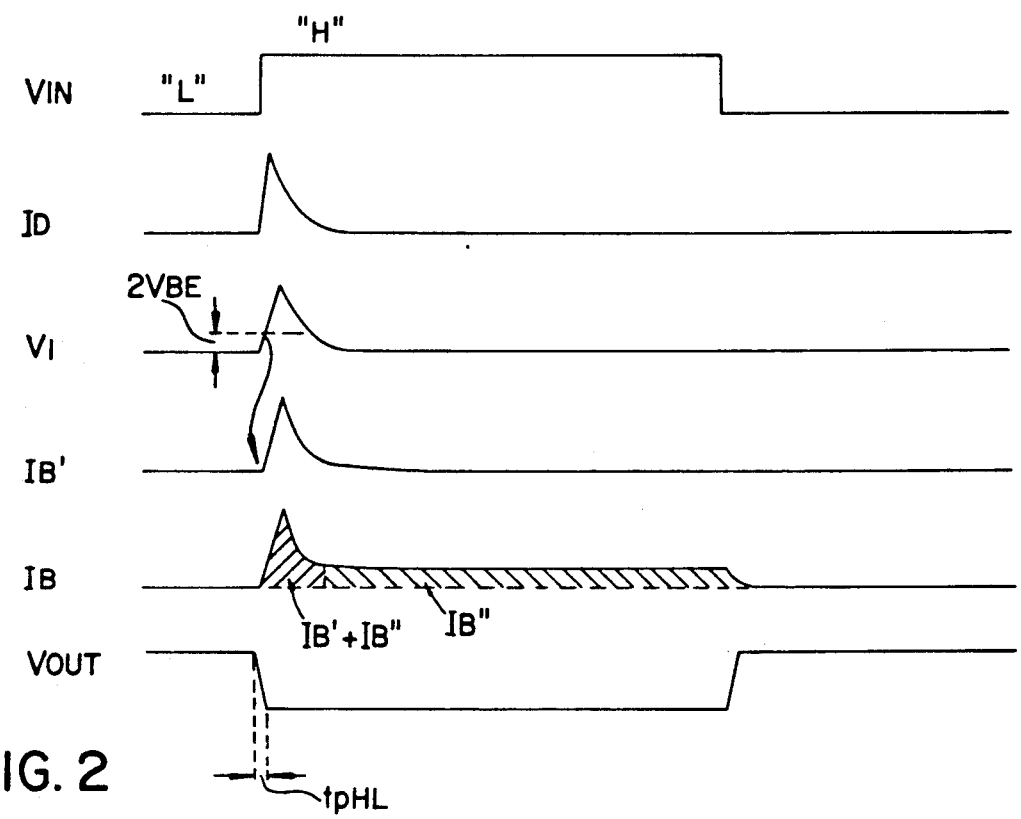
FIG. 2 is a timing diagram of the FIG. 1 embodiment.

The shortening of $t_{PHL}$ will hereinafter be described in accordance with the timing diagram of FIG. 2. If both $M_{p1}$ and $M_{n2}$ and are concurrently turned on as the input signal $V_{IN}$ makes a low-to-high transition, then the current $I_D$ flows through the transistors $M_{p1}$ and $M_{n2}$. The current $I_D$ causes the base voltage $V_1$ of $Q_4$ to increase. If the voltage $V_1$ exceeds $2 V_{BE}$, $Q_4$ is turned on and $I_{B'}$ flows. The current $I_{B'}$ is added to the current $I_{B''}$ that flows through $M_{n1}$. As a result, since the base current $I_B$ of $Q_3$ is increased by the amount of $I_{B'}$, the turn-on speed of $Q_3$ can be made faster.

As described above, in the embodiment of the present invention, when the input signal $V_{IN}$ makes a transition from a low to a high, the base current of the output transistor $Q_3$ is increased by supplying the current from $Q_4$ of the auxiliary drive circuit 2. Consequently, the turn-on speed of $Q_3$ can be made faster and therefore $t_{PHL}$ can be shortened.

Although the above described embodiment is applied to an inverter, it is noted that it may also be applied to a logic circuit in which input and output signals $V_{IN}$ and $V_{OUT}$ change in the same logic state. In that case, the area of $M_{n2}$ is made smaller than that of $M_{p1}$ so that the turn-on speed of $M_{n2}$ can be made slower when $V_{IN}$ makes a transition from a high to a low. Consequently, the base current of $Q_3$ can be increased in the same way.

Figure 3:
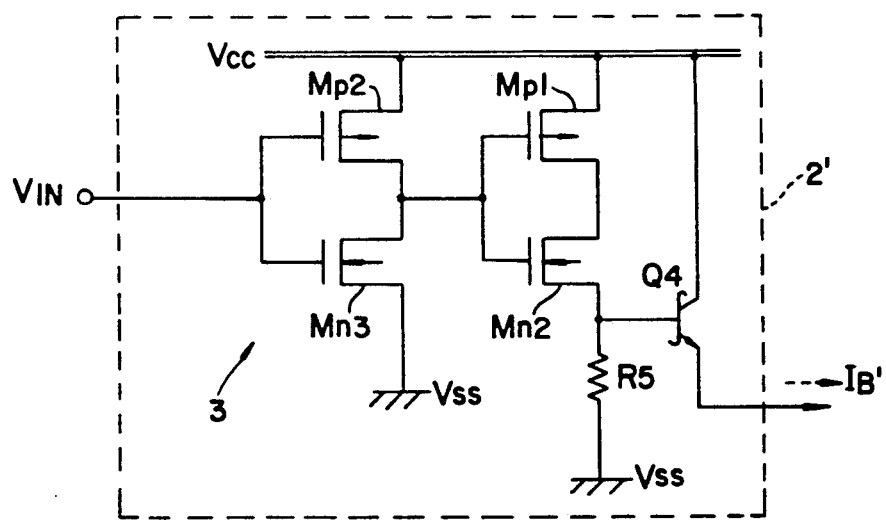
FIG. 3 is a schematic view illustrating another embodiment of the Bi-CMOS circuit in accordance with the present invention.

FIG. 3 schematically shows another embodiment of the auxiliary drive circuit 2 of FIG. 1. In this embodiment, an auxiliary drive circuit 2' is provided at its input side with an inverter stage 3 comprising a P-channel MOS transistor $M_{p2}$ and an N-channel MOS transistor $M_{n3}$. When the input signal $V_{IN}$ makes a transition from a high to a low, the turn-on speed of $M_{n2}$ can be made slower. In the same way, the base current of $Q_3$ can be increased.

Figure 4:
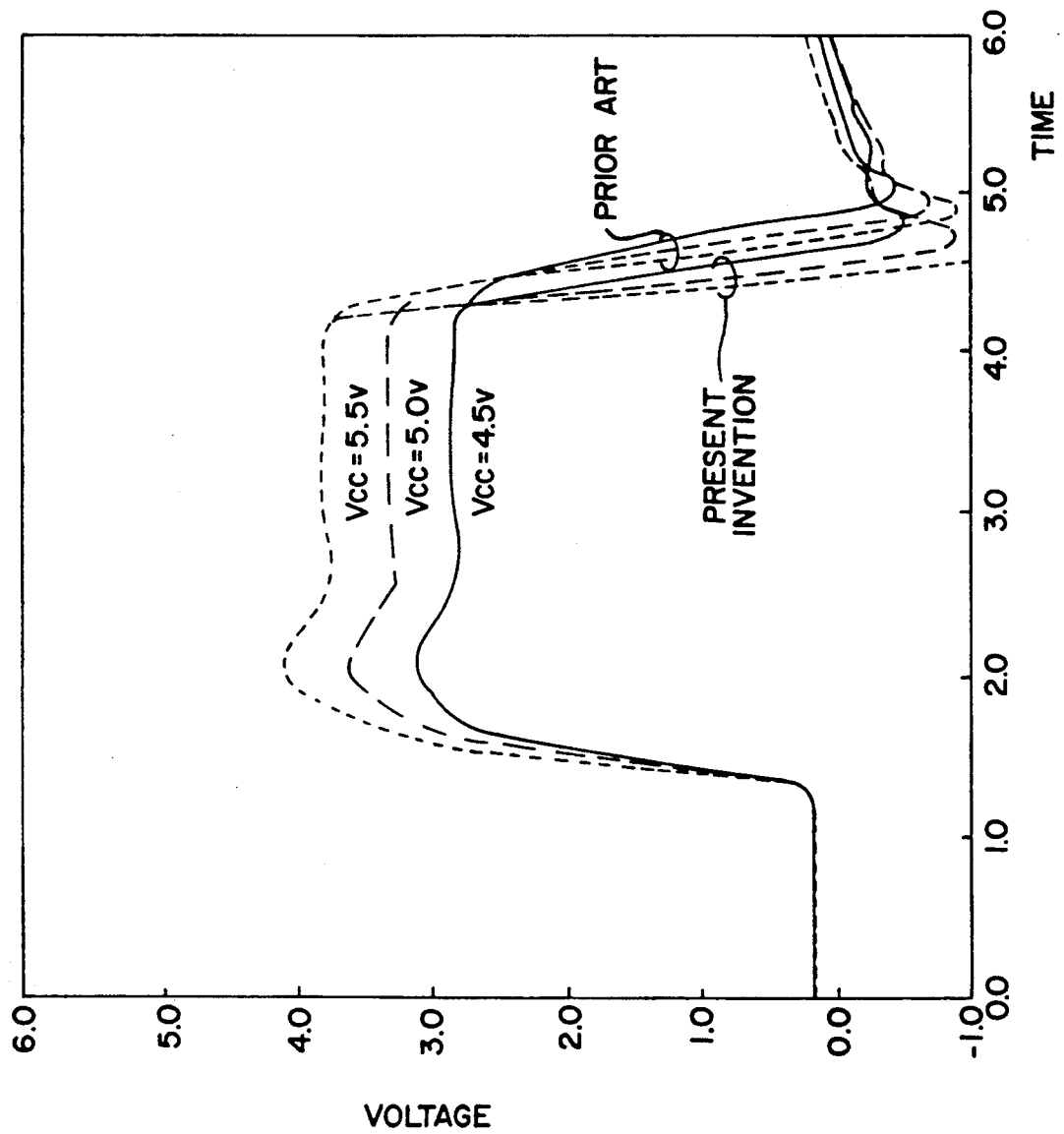
FIG. 4 is a waveform diagram of the output signals from the FIG. 1 embodiment.

FIG. 4 illustrates the waveform of the output signal $V_{OUT}$. $V_{cc}$ was set to 5.5 V, 5.0 V and 4.5 V, and each $t_{PHL}$ according to the present invention was compared with that of the conventional logic circuit. It will be understood from FIG. 4 that, with the rapid turn-on speed of $Q_3$, the high-to-low transition according to the present invention is faster than that of the conventional logic circuit.

Figure 5:
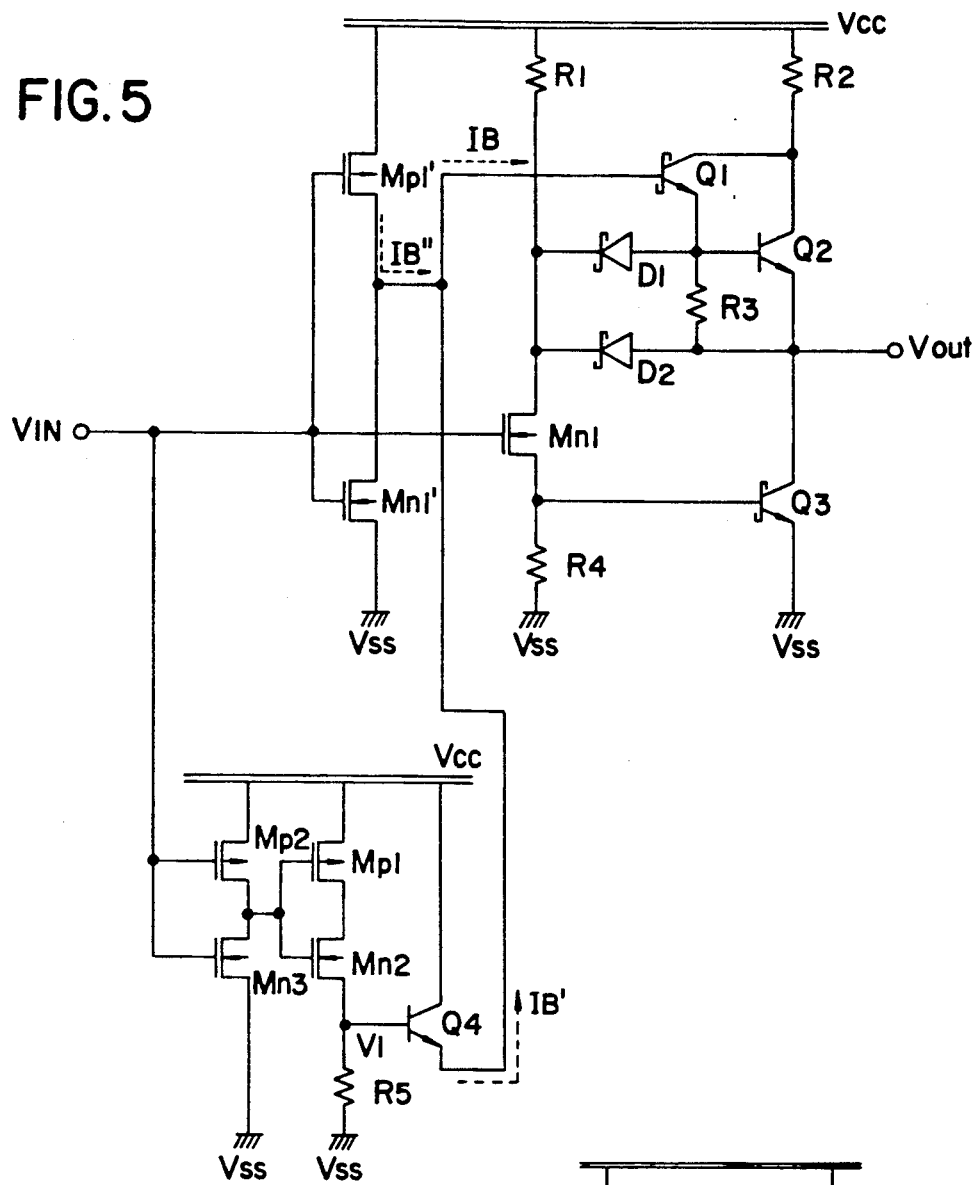
FIG. 5 is a schematic view illustrating a third embodiment of the Bi-CMOS circuit in accordance with the present invention.
Figure 7:
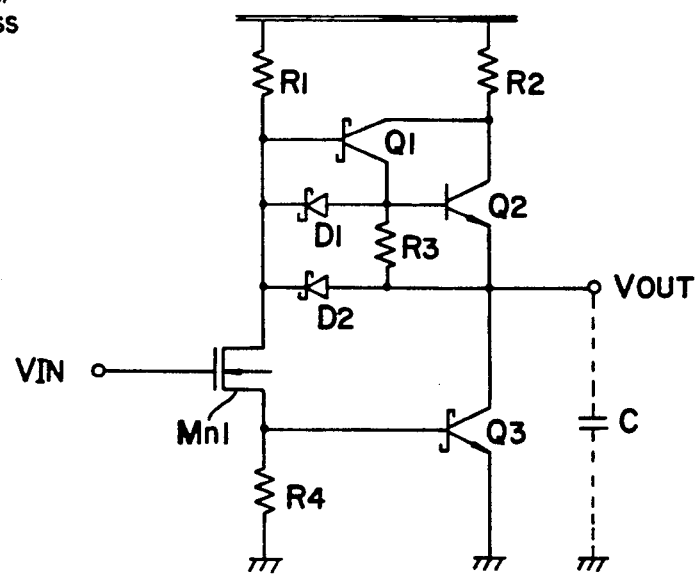
FIG. 7 is a schematic diagram of a conventional logic circuit.
Figure 6:
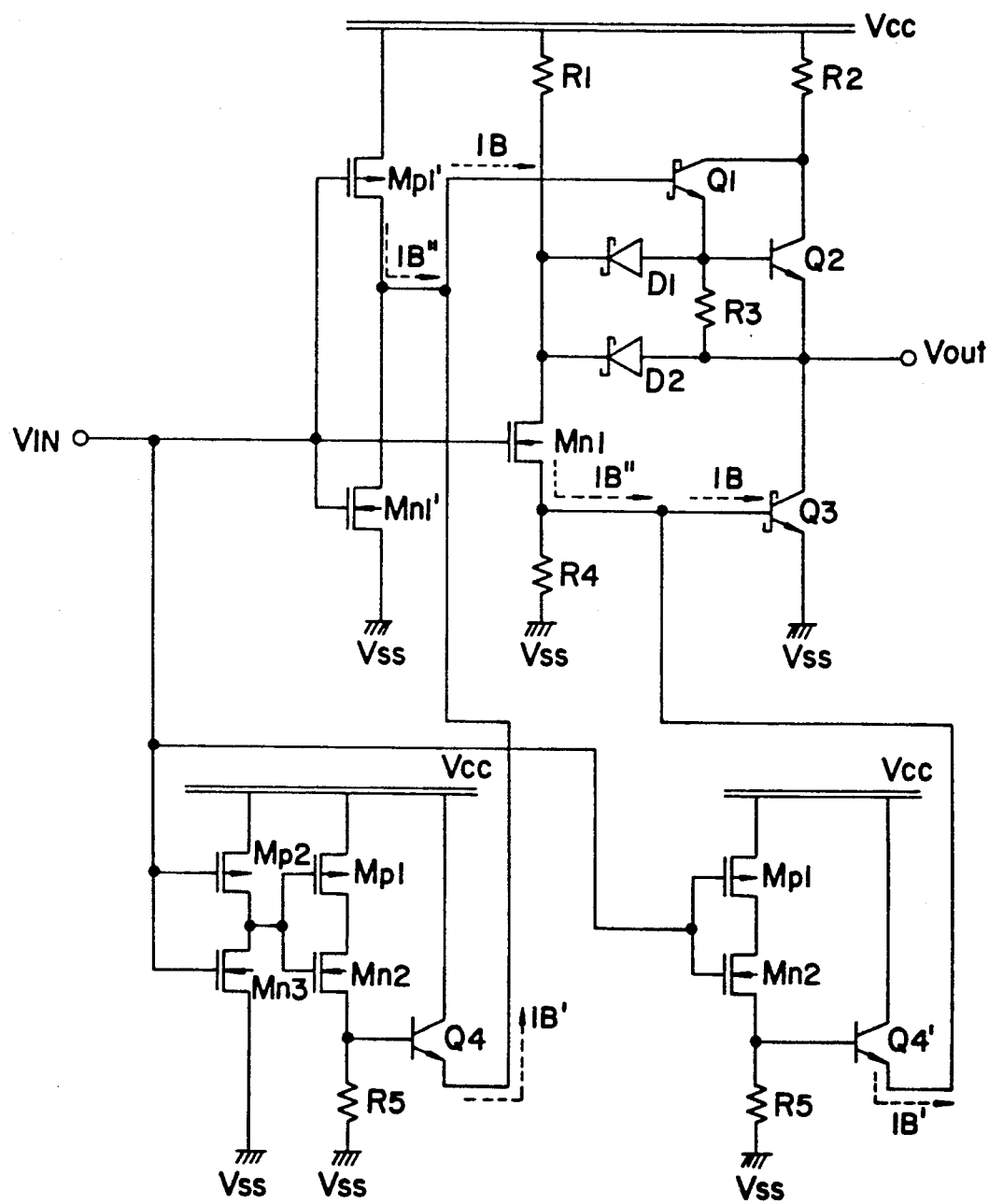
FIG. 6 is a schematic view illustrating a fourth embodiment of the Bi-CMOS circuit in accordance with the present invention.

While the present invention has been applied in order to improve $t_{PHL}$, it is noted that it is also applicable to improve $t_{PLH}$. FIG. 5 schematically illustrates a Bi-CMOS circuit to which the present invention is applied to improve $t_{PLH}$. The same reference characters will be applied to the same parts as FIG. 1 and therefore a detailed description will not be given. In the embodiment of FIG. 5, the base current $I_{B'}$ of $Q_4$ is added to the base current $I_{B'}$ of $Q_1$, so that the turn-on speed of $Q_2$ is made faster and the propagation delay time $t_{PLH}$ of the output signal $V_{OUT}$ is shortened. In addition, the present invention is applicable to improve both $t_{PHL}$ and $t_{PLH}$. FIG. 6 schematically illustrates a Bi-CMOS circuit in which both $t_{PHL}$ and $t_{PLH}$ are shortened in accordance with the present invention. As shown in FIG. 6, the base currents of $Q_2$ and $Q_3$ are increased in the same manner as those of the embodiments of FIGS. 1 and 5, so both $t_{PHL}$ and $t_{PLH}$ can be shortened.

While certain representative embodiments and details have been shown for the purpose of illustrating the invention, it will be apparent to those skilled in this art that various changes and modifications may be made therein without departing from the scope of the invention.

We claim:
1. A BI-CMOS circuit comprising:
   a first transistor made from an N-channel MOS transistor that is turned on and off in response to the logic state of an input signal and that supplies a first current to a base of an output transistor when the first transistor is turned on; and
   an active pull-down current supplying means connected to the gate electrode of said first transistor and for supplying a second current, which is active pull-down current, to the base of said output transistor so that said first and second currents can be supplied to the base of said output transistor, wherein said active pull-down current supplying means includes
   a second transistor made from a p-channel MOS transistor and having a gate electrode connected to the gate electrode of said first transistor,
   a third transistor made from an N-channel MOS transistor and having a gate electrode connected to the gate electrode of said second transistor, the third transistor being connected in series with said second transistor, and
   a fourth transistor made from a bipolar-transistor and having a base connected to a source of said third transistor and an emitter connected to the base of said output transistor.

2. A Bi-CMOS circuit as set forth in claim 1, wherein said second transistor is substantially identical in area with said third transistor.

3. A Bi-CMOS circuit as set forth in claim 1, wherein said second transistor is greater in area than said third transistor.

4. A BI-CMOS circuit comprising:
   a first transistor made from an N-channel MOS transistor that is turned on and off in response to the logic state of an input signal and that supplies a first current to the base of an output transistor when the first transistor is turned on; and
   an active pull-down current supplying means connected to the gate electrode of said first transistor and for supplying a second current, which is active pull-down current, to the base of said output transistor so that said first and second currents can be supplied to the base of said output transistor, wherein said active pull-down current supplying means includes
   a second transistor made from a p-channel MOS transistor and having a gate electrode connected to the gate electrode of said first transistor,
   a third transistor made from an N-channel MOS transistor and having a gate electrode connected to the gate electrode of said second transistor, a source of the third transistor being connected in series with a drain of said second transistor,
   a fourth transistor made from a p-channel MOS transistor,
   a fifth transistor made from an N-channel MOS transistor and having a gate electrode connected to a gate electrode of said fourth transistor, a source of the fifth transistor being connected in series with a drain of said fourth transistor, a source of said second transistor being connected to a source of said fourth transistor, and
   a sixth transistor made from a bipolar transistor and having a base connected to said fifth transistor and an emitter connected to the base of said output transistor.

* * * * *